US 6,545,227 B2

(12) United States Patent
Silverman

(10) Patent No.: US 6,545,227 B2
(45) Date of Patent: Apr. 8, 2003

(54) POCKET MOUNTED CHIP HAVING MICROSTRIP LINE

(75) Inventor: Lawrence H. Silverman, Dix Hills, NY (US)

(73) Assignee: MCE/KDI Corporation, Whippany, NJ (US)

( * ) Notice: Subject to any disclaimer, the term of this patent is extended or adjusted under 35 U.S.C. 154(b) by 0 days.

(21) Appl. No.: 09/903,292

(22) Filed: Jul. 11, 2001

(65) Prior Publication Data

US 2003/0012006 A1 Jan. 16, 2003

(51) Int. Cl.⁷ .................................................. H05K 1/16
(52) U.S. Cl. ....................... 174/260; 361/774; 361/776; 361/783; 361/795; 257/223; 257/784
(58) Field of Search ......................... 174/260; 361/772, 361/776, 779, 780, 783, 792, 793, 794, 795, 774; 257/723, 724, 784

(56) References Cited

U.S. PATENT DOCUMENTS

| | | | |
|---|---|---|---|
| 4,092,664 A | | 5/1978 | Davis, Jr. |
| 4,342,090 A | | 7/1982 | Caccoma et al. |
| 4,410,927 A | | 10/1983 | Butt |
| 4,547,795 A | * | 10/1985 | Wulff .......................... 257/665 |
| 4,670,981 A | | 6/1987 | Kubota et al. |
| 4,750,092 A | * | 6/1988 | Werther ....................... 361/400 |
| 4,822,988 A | * | 4/1989 | Gloton ........................ 235/380 |
| 4,849,284 A | * | 7/1989 | Arthur et al. ................ 174/255 |
| 4,866,571 A | | 9/1989 | Butt |
| 4,931,853 A | | 6/1990 | Ohuchi et al. |
| 5,014,159 A | | 5/1991 | Butt |
| 5,048,179 A | | 9/1991 | Shindo et al. |
| 5,055,637 A | | 10/1991 | Hagner |
| 5,455,385 A | | 10/1995 | Newton et al. |
| 5,468,999 A | * | 11/1995 | Lin et al. ..................... 257/700 |
| 5,477,083 A | | 12/1995 | Kawai |
| 5,490,324 A | * | 2/1996 | Newman .................... 174/52.4 |
| 5,510,758 A | | 4/1996 | Fujita et al. |
| 5,578,796 A | * | 11/1996 | Bhatt et al. .................. 174/252 |
| 5,611,876 A | | 3/1997 | Newton et al. |
| 5,745,984 A | * | 5/1998 | Cole et al. ................... 174/259 |
| 6,014,318 A | * | 1/2000 | Takeda ........................ 174/255 |
| 6,037,044 A | * | 3/2000 | Giri et al. .................... 174/255 |
| 6,201,185 B1 | * | 3/2001 | Ishida et al. ................. 174/260 |
| 6,350,954 B1 | * | 2/2002 | Specks et al. ............... 174/255 |
| 6,359,234 B1 | * | 3/2002 | Kouda ......................... 174/255 |

* cited by examiner

Primary Examiner—Albert W. Paladini
Assistant Examiner—José H. Alcala
(74) Attorney, Agent, or Firm—Dykema Gossett PLLC

(57) ABSTRACT

An integrated circuit device includes a semiconductor chip, a circuit board and a layer of bonding material. The semiconductor chip has a metal plated surface on a first side and has a predetermined thickness. A first conductive layer formed of electrically conductive material is bonded to a first side of a first dielectric layer and defines a plurality of conducting elements. A second conductive layer defining a first electrical ground plane and formed of electrically conductive material is bonded to a second side of the first dielectric layer opposite the first conductive layer. The circuit board has a pocket formed therein, passing through the first conductive layer and through the first dielectric layer. The pocket is closed on the second side by the second conductive layer. A portion of the second conductive layer is exposed at a bottom of the pocket. The pocket is of substantially the same size and shape as the semiconductor chip. The pocket receives the semiconductor chip with the first side of the semiconductor chip disposed toward the second conductive layer. A layer of conductive bonding material is disposed in the pocket between the metal plated surface of the semiconductor chip and the second conductive layer. The layer of bonding material mechanically and electrically connects the semiconductor chip to the second conductive layer.

18 Claims, 3 Drawing Sheets

POCKET MOUNTED CHIP HAVING MICROSTRIP LINE

FIELD OF THE INVENTION

This invention relates in general to the mounting of chips to circuit boards, and in particular to mounting chips to microstrip boards.

BACKGROUND OF THE INVENTION

Integrated circuit semiconductor chips, or simply chips, are mounted to microstrip boards as a means of connecting the chips to other chips and to other electronic devices. A common means of mounting chips to boards is to simply bond them to an upper surface of the board. The chip is electrically connected to ground by providing a copper sleeve down a hole, also known as a via, from the surface to the ground plane. That approach risks introducing a discontinuity of the ground plane that is inadequate for some applications. Such an application is the use of ground vias for connecting a monolithic chip employed at high microwave and millimeter wave frequencies. At such frequencies, the vias act as inductors, resulting in an effective discontinuity in the ground connection. Surface mounting is further disadvantageous in that it results in the chip being vulnerable to being damaged by handling of the assembled boards.

It is desired to provide a semiconductor device which in turn provides a consistently reliable ground to chip connection at high frequencies between a circuit board ground plane and a chip. It is also desired to provide a chip mounting arrangement less vulnerable to damage due to handling than a surface mounted chip. It is further desired to provide a semiconductor device which in turn provides a consistently reliable ground to chip connection at high frequencies between a microstrip line board ground plane and a chip. It is yet further desired to provide a method of fabricating a semiconductor device which in turn provides a consistently reliable ground to chip connection at high frequencies between a circuit board ground plane and a chip.

SUMMARY OF THE INVENTION

An integrated circuit device includes a semiconductor chip, a circuit board and a layer of bonding material. The semiconductor chip has a surface plated with gold or another metal backing (e.g., aluminum or silver) on a first side and has a predetermined thickness. The circuit board has a first dielectric layer formed of dielectric material. The circuit board has a first conductive layer formed of electrically conductive material and bonded to a first side of the first dielectric layer and defining a plurality of conducting elements. The circuit board has a second conductive layer defining a first electrical ground plane formed of electrically conductive material and bonded to a second side of the first dielectric layer opposite the first conductive layer. The circuit board has a pocket formed therein. The pocket passes through the first conductive layer and through the first dielectric layer. The pocket is open on the first side. The pocket is closed on the second side by the second conductive layer. A portion of the second conductive layer is exposed at a bottom of the pocket. The pocket is of substantially the same size and shape as the semiconductor chip. The pocket receives the semiconductor chip with the first side of the semiconductor chip disposed toward the second conductive layer. The layer of bonding material is disposed in the pocket between the metal plated surface of the semiconductor chip and the second conductive layer. The layer of bonding material mechanically and electrically connects the semiconductor chip to the second conductive layer.

An integrated circuit device includes a semiconductor chip and a microstrip board and a layer of bonding material joining the chip and the microstrip board. The semiconductor chip has a surface plated with gold or another metal backing on a first side and has a predetermined thickness. The microstrip line board has a first dielectric layer formed of dielectric material. A first transmission layer is formed of electrically conductive material and is bonded to a first side of the first dielectric layer. The first transmission layer defines a plurality of conducting elements including a microstrip transmission line and a plurality of adjacent ground lines. A first ground plane layer is formed of electrically conductive material and is bonded to a second side of the first layer. The first ground plane layer defines a first electrical ground plane and is electrically connected to the ground lines by a plurality of vias extending from the first ground plane to the ground lines. The board has a pocket formed therein passing through the first transmission layer and through the first dielectric layer. The pocket is open on the first side and is closed on the second side by the first ground plane layer. A portion of the ground plane layer is exposed at a bottom of the pocket. The pocket is of substantially the same size and shape as the semiconductor chip. The pocket receives the semiconductor chip with the first side of the semiconductor chip disposed toward the ground plane layer. The layer of bonding material is disposed in the pocket between the metal surface of the semiconductor chip and the first ground layer. The layer of bonding material mechanically and electrically connects the semiconductor chip to the first ground layer.

A method of fabricating a semiconductor device includes the following steps. A semiconductor integrated circuit chip is formed, having a gold or other metal surface on one side thereof. A first substantially planar double sided laminate is formed, having a first dielectric layer formed of dielectric material and having a first conductive layer bonded to a first side of the dielectric layer and having a second conductive layer bonded to a second side of the dielectric layer opposite the first side. Portions of the first conductive layer are removed by etching the first conductive layer to define a plurality of discrete conducting elements. A predetermined amount of the first dielectric layer is removed to define a pocket therein of approximately the same size and shape as the integrated circuit chip. The pocket extends through the first conductive layer and through the first dielectric layer. The pocket is closed on the second side by the second conductive layer. Exposed surfaces of the first conductive layer and of a portion of the second conductive layer exposed inside of the pocket are plasma etched to clean the exposed surfaces. The surfaces cleaned by plasma etching are plated with gold or another metal. The metal layer of the integrated circuit is mechanically and electrically connected to a metal plated surface at an end of the pocket with a conductive bonding material.

The invention provides a semiconductor device which in turn provides a consistently reliable ground to chip connection at high frequencies between a circuit board ground plane and a chip. The invention also provides a chip mounting arrangement less vulnerable to damage due to handling than a surface mounted chip. The invention further provides a semiconductor device which in turn provides a consistently reliable ground to chip connection at high frequencies between a microstrip line board ground plane and a chip. The invention yet further provides a method of fabricating a semiconductor device which in turn provides a consistently reliable ground to chip connection at high frequencies between a circuit board ground plane and a chip.

DESCRIPTION OF PREFERRED EMBODIMENTS

Figure 1:
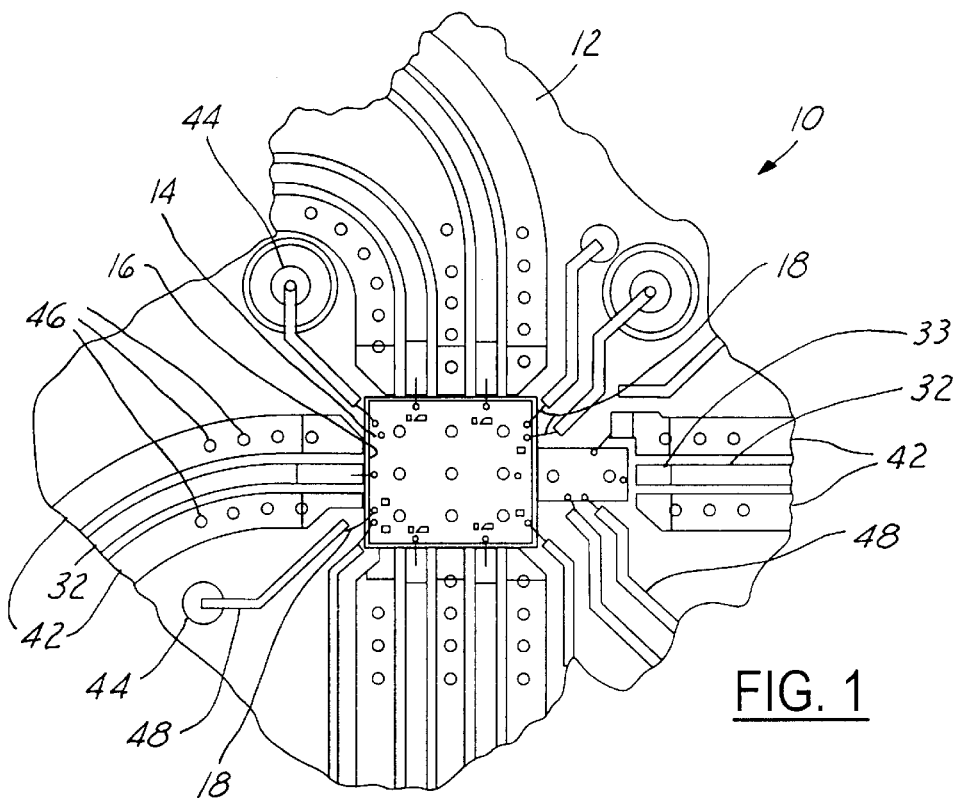
FIG. 1 is a plan view of a circuit board with a chip disposed therein.
Figure 2:
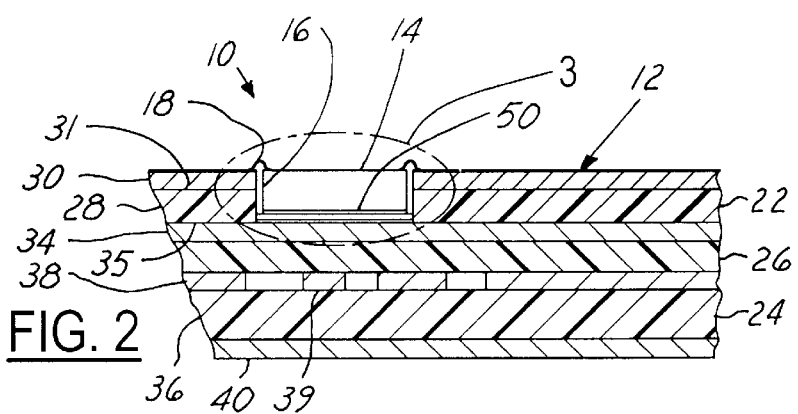
FIG. 2 is a sectional side view of the circuit board of FIG. 1.
Figure 3:
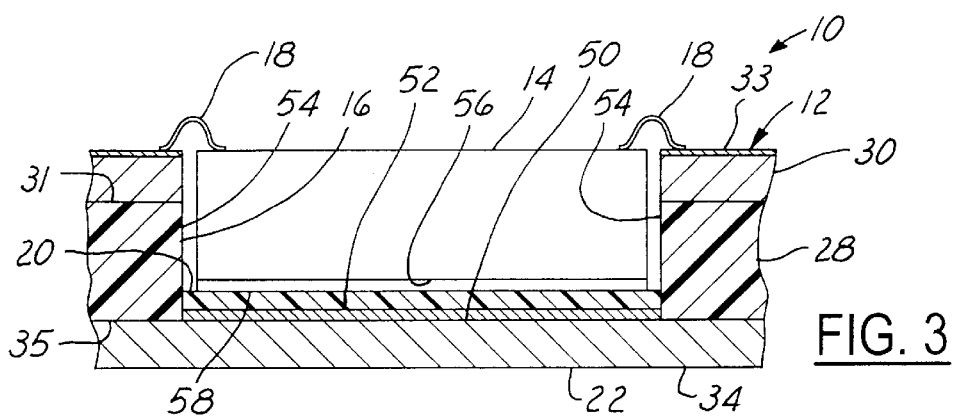
FIG. 3 is a sectional side view of a broken out portion of the circuit board in circle 3 of FIG. 2.

An integrated circuit device 10, best shown in FIGS. 1 and 2, includes a circuit board 12 and a semiconductor chip 14. Circuit board 12 is, in one application, a microstrip line board and semiconductor chip 14 is a monolithic chip. A monolithic chip is one in which all of the circuitry of the device are completely contained on the chip. Chip 14 is disposed in a pocket 16 formed in circuit board 12 such that chip 14 is nearly flush with a top or outermost surface 17 of circuit board 12. A plurality of metal wires 18 extend between chip 14 and circuit board 12. A bonding material 20 best shown in FIG. 3, preferably a silver filled epoxy, is disposed between circuit board 12 and chip 14 to electrically and mechanically connect chip 14 with a first ground plane of circuit board 12.

Circuit board 12 is formed by sandwiching a first double sided laminate 22 and a second double sided laminate 24 over an intermediate dielectric layer 26. Each of double sided laminates 22 and 24 is in turn a conductor/dielectric/conductor sandwich. The resulting circuit board 12 has four conductor layers interleaved with three dielectric layers. A first dielectric layer 28, the dielectric layer of first double sided laminate 22, is a sheet of polytetrafluoroethylene. First dielectric layer 28 has approximately the same thickness as a thickness of the semiconductor chip 14. In one exemplary embodiment, chip A and dielectric layer 28 are approximately five to six mils (0.13 to 0.15 mm) thick. Semiconductor chip 14 is preferably slightly thicker than the thickness of the first dielectric layer 28. It should be appreciated that while the described exemplary embodiment includes four conductive layers and three dielectric layers, an alternative embodiment might include only a single dielectric layer and two conductive layers.

A first conductive layer 30, one of the conductive layers of the first double sided laminate, is formed of copper foil, approximately 0.5 mils (0.013 mm) thick. First conductive layer 30 is bonded to a first side 31 of first dielectric layer 28. First conductive layer 30 defines a plurality of conducting elements, including microstrips 32 also known as microwave transmission lines. Portions of first conductive layer 30, particularly microstrips 32, are plated with gold or another metal to provide a metal layer 33 on an outer surface thereof. In one exemplary embodiment, the metal layer 33 is made of gold and layer 33 is approximately 0.050 mils (0.001 mm) thick.

A second conductive layer 34 is bonded to a second side 35 of first dielectric layer 28, opposite first side 31. Second conductive layer 34 is also formed of copper foil and is approximately 0.5 mils (0.013 mm) thick. Second conductive layer 34 serves as a first ground plane in circuit board 12.

Second double sided laminate 24 has at its core a second dielectric layer 36 formed of fiberglass reinforced epoxy resin satisfying the FR4 standard established by the National Electrical Manufacturers Association (NEMA). Second dielectric layer 36 is of a predetermined thickness. Second dielectric layer 36 imparts a desired stiffness to circuit board 12.

A third conductive layer 38 is adhesively bonded to a first side of second dielectric layer 36. Third conductive layer 38 is formed of copper foil having an appropriate predetermined thickness. Third conductive layer 38 defines a plurality of direct current (DC) and control signal lines 39 shown schematically in section in FIGS. 3 and 7 through 13.

A fourth conductive layer 40 is bonded to a second side of second dielectric layer 36. Fourth conductive layer 40 is formed of copper foil of a predetermined thickness, and serves as a second ground plane.

As mentioned above, first conductive layer 30 includes microstrip lines 32. First conductive layer 30 also includes ground lines 42 on each side of microstrip lines 32. As with microstrip lines 32, ground lines 42 are plated with plated with gold or another metal. Control vias extend from connecting areas on first side 31 of first dielectric layer 28 to third conductive layer 38. It should be appreciated that openings are formed in second conductive layer 34 to allow control and DC vias 44 to pass therethrough without electrically contacting second conductive layer 34. Ground lines 42 are likewise connected with second conductive layer 34 through ground vias 46. Control and DC conducting lines 48 are provided on side 31 to facilitate connecting chip 14 and the control and DC conducting vias 44 with wires 18.

Pocket 16 passes through first conductive layer 30 and first dielectric layer 28 and ends at second conductive layer 34. Second conductive layer 34 defines an end 50 of pocket 16. A portion 50 of the second conductive layer 34 exposed at a bottom or end of pocket 16 is plated with gold or another metal, having a metal layer 52. Side walls 54 of pocket 16 are defined by first dielectric layer 28. The shape and size of pocket 16 is substantially the same as that of semiconductor chip 14.

Semiconductor chip 14 has a contact patch 58 on a bottom surface 56. Contact patch 58 in a preferred embodiment includes a layer of metal 58 such as gold, although it could assume other forms, such as a bump of gold or a layer or bump of an alternative low resistance conducting material.

The intermediate dielectric layer 26 is formed of an appropriate prepreg, such as fiberglass reinforced epoxy.

Intermediate dielectric layer 26 is bonded on a first side to second conductive layer 34 and on an opposite second side to third conductive layer 38. It should be appreciated that, alternatively, second double sided laminate 24 could be reversed, and second ground plane 40 bonded to third dielectric layer 26.

Bonding material 20 electrically connects conductive feature 58 with metal layer 52. Silver filled epoxy is the preferred bonding material because it provides the desired mechanical and electrical connection between chip 14 and pocket 16. Silver filled epoxy has the additional benefit of not deteriorating or removing the metal layers 52 and 58 from portion 50 and bottom surface 56.

The benefits of the present invention are better appreciated with an understanding of the fabrication of the module. The fabrication steps as described below are best shown in FIGS. 4–13.

Figure 4:
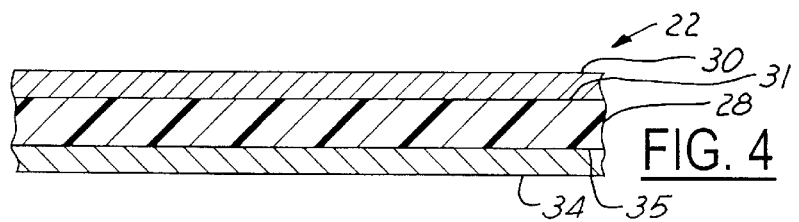
FIG. 4 is a sectional side view of a first planar double sided laminate.

A semiconductor integrated chip 14 is formed to have a predetermined thickness and to have a conductive surface formed of gold or another metal on one side thereof. First double sided laminate 22, best shown in FIG. 4, is formed by bonding first conductive layer 30 to first side 31 of dielectric layer 28, and second conductive layer 34 to second side 35. Such double sided laminate is widely available from commercial suppliers of the same. The thickness of first dielectric layer 28 is chosen so that it is substantially equal to, but slightly less than, the predetermined thickness of chip 14. The material of which first dielectric layer 28 is formed, polytetrafluoroethylene, is selected to provide the desired combination of mechanical and electrical characteristics.

Figure 5:
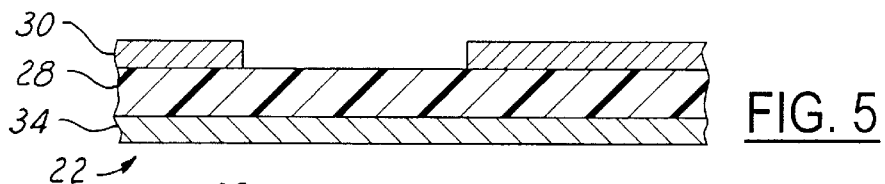
FIG. 5 is a sectional side view of the first double sided laminate of FIG. 4 after being etched.
Figure 6:
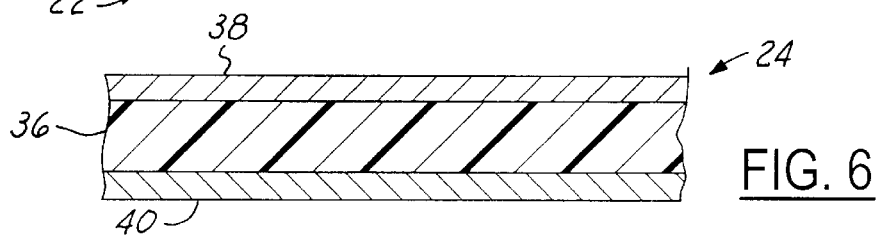
FIG. 6 is a sectional side view of a second planar double sided laminate.
Figure 7:
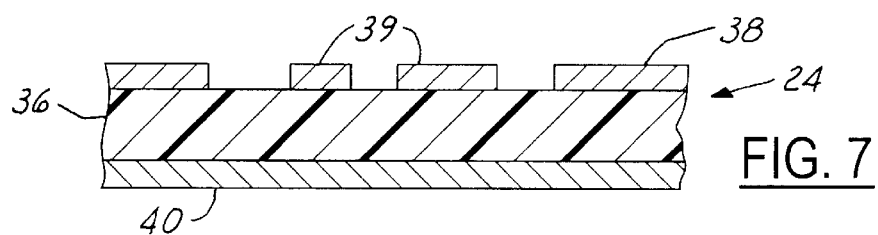
FIG. 7 is a sectional side view of the second planar double sided laminate of FIG. 6 after being etched.

Portions of first conductive layer 30 are removed by etching first conductive layer 30, to define a plurality of discrete conducting elements 32,42 and 48 best shown in FIG. 1. Chemical etching, combined with photolithography is one known method of selectively removing portions of first conductive layer 30. FIG. 5 shows laminate 22 with the portion of conductive layer 30 removed over the position of yet to be formed pocket 16. The etching results in the formation of microstrips 32 and ground lines 42. Control and DC conducting lines 48 for connecting chip 14 with vias 44 are also etched.

Second conductive layer 34 is etched in certain predetermined areas (not shown) to remove portions thereof to accommodate the passage of control vias 44.

Second double sided laminate 24 is formed by bonding third conductive layer 38 to a first side of second dielectric layer 36, and bonding fourth conductive layer 40 to the second side of second dielectric layer 36. Such laminate is typically purchased from a supplier of such material.

Third conductive layer 38, also by a combination of photolithography and chemical etching, has portions of the third conductive layer removed to define a plurality of discrete conducting elements, specifically, a plurality of control and DC conducting lines 39. Second double sided laminate 24 is formed to the FR4 standard. The second dielectric layer 36 is formed of fiberglass fibers in combination with an epoxy resin binder.

Intermediate dielectric layer 26 is similarly formed of fiberglass and epoxy resin. However, alternative forms of prepreg, or resin impregnated fibers, may be employed.

Figure 8:
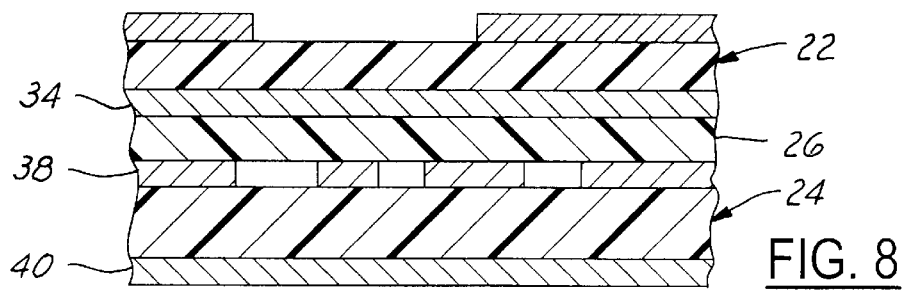
FIG. 8 is a sectional side view of the assembled first and second planar double sided laminates of FIGS. 5 and 7 respectively.

With the first double sided laminate 22, the intermediate dielectric layer 26 and the second double sided laminate 24 oriented relative to each other in predetermined positions, the second conductive layer 34 is bonded to first side of intermediate dielectric layer 26, and third conductive layer 38 is bonded to a second side of intermediate dielectric layer 26, as best shown in FIG. 8.

Figure 9:
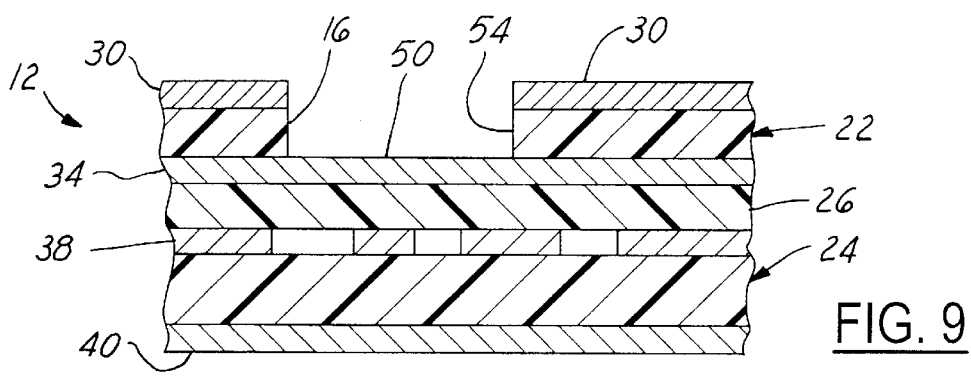
FIG. 9 is a sectional side view of the laminate of FIG. 8 showing a pocket therein.
Figure 10:
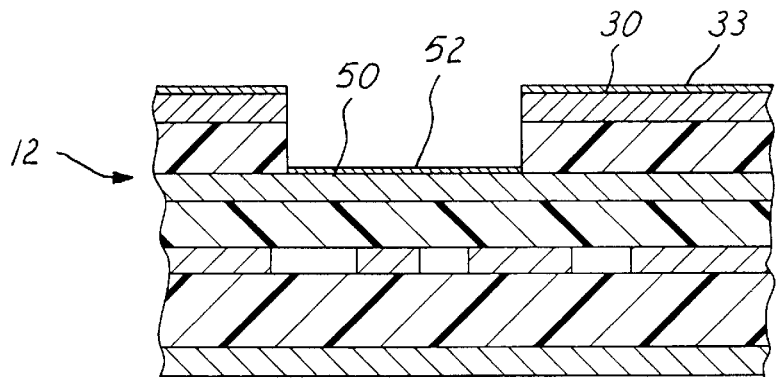
FIG. 10 is a sectional side view of the laminate of FIG. 9 showing a metal plated layer thereon.

Pocket 16 is excavated by removing a predetermined amount of first dielectric layer 28. The material is removed is to form pocket 16 so that it is approximately the same size and shape as chip 14 and able to receive chip 14. A laser is used to excavate pocket 16. After pocket 16 has been formed by a laser, there is a residue of burnt material disposed over portion 50. Additionally, chemical etching leaves a residue disposed over first conductive layer 30. Plasma etching is employed to clean certain of the exposed surfaces of first conduct layer 30 and portion 50. The newly formed pocket is best shown in FIG. 9.

After completion of plasma etching, certain of the cleaned surfaces are plated with gold or another metal, receiving a .05 mil thick layer of the metal. Portion 50 and microstrip 32 and ground lines 42 are plated, at least in part, with a layer of metal 52 and 33 respectively. The metal plating is desirable on microstrip 32 and ground lines 42 to facilitate solderless connecting of wires 18 with the metal plated areas. The layer of metal 52 on portion 50 enables a reliable electrical connection between chip 14 and ground plane 34.

Figure 11:
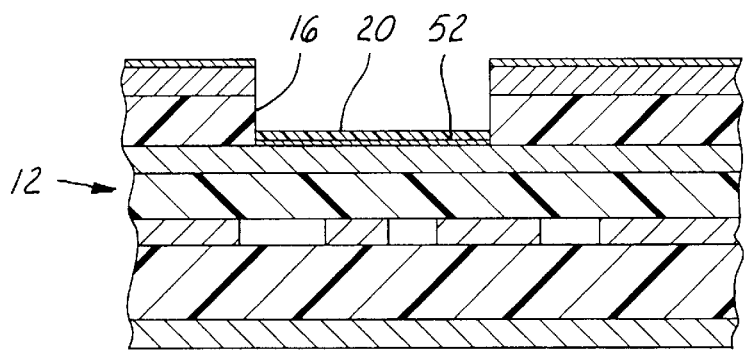
FIG. 11 is a sectional side view of the laminate of FIG. 10 showing epoxy adhesive in the pocket.
Figure 12:
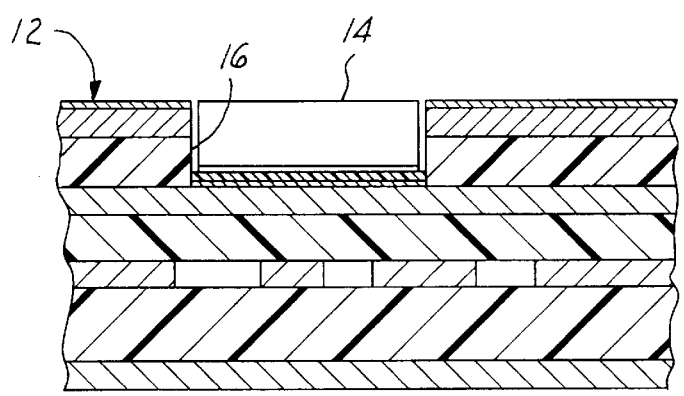
FIG. 12 is a sectional side view of the laminate of FIG. 11 showing a chip disposed within the pocket.
Figure 13:
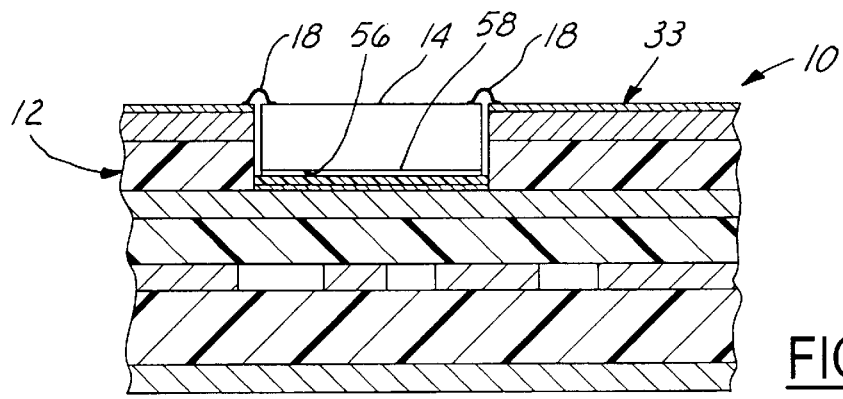
FIG. 13 is a sectional side view of the laminate of FIG. 12 showing wires connecting the chip and the laminate.

After the plating, a precisely pre-measured amount of liquid silver epoxy 20 is applied to an inside of pocket 16, over bottom surface 56, as shown in FIG. 11. Chip 14 is pressed against epoxy 20. Alternatively, a semi-rigid epoxy preform may be used as bonding material 20. The epoxy preform is placed within the pocket over portion 50 and chip 14 pressed against the epoxy. Another bonding alternative is to employ a solder which does not deleteriously affect metal plating. A pre-measured amount of solder would be placed in pocket 16, and chip 14 placed in pocket 16 over the solder. Circuit board 12 and chip 14 would be heated to the melting point of the solder to achieve the desired mechanical and electrical bonding of chip 14 to metal layer 52. One type of such a solder is indium solder.

Lastly, wires 18 are bonded to both chip 14 and to the metal plated areas on circuit board 12.

The embodiments disclosed herein have been discussed with the purpose of familiarizing the reader with the novel aspects of the invention. Although preferred embodiments of the invention have been shown and disclosed, many changes, modifications and substitutions may be made by one having ordinary skill in the art without necessarily departing from the spirit and scope of the invention as described in the following claims.

I claim:

1. An integrated circuit device comprising:
    a semiconductor chip having a contact patch on a first side and having a predetermined thickness;
    a microstrip line board having:
    a first dielectric layer formed of dielectric material,
    a first conductive layer formed of electrically conductive material and bonded to a first side of the first dielectric layer and defining a plurality of conducting elements including a microstrip transmission line,
    a second conductive layer defining a first electrical ground plane formed of electrically conductive material and bonded to a second side of the first dielectric layer opposite the first conductive layer, and
    the microstrip line board having a pocket formed therein passing through the first conductive layer and through the first dielectric layer and the pocket being open on the first side and being closed on the second side by the second conductive layer and a portion of the second conductive layer being exposed at a bottom of the pocket and the pocket being of substantially the same size and shape as the semiconductor chip and the pocket receiving the semiconductor chip with the first side of the semiconductor chip disposed toward the second conductive layer; and a layer of bonding material disposed in the pocket between the contact patch of the semiconductor chip and the second conductive layer, and the layer of bonding material mechanically and electrically connecting the semiconductor chip to the second conductive layer.

2. An integrated circuit device as claimed in claim 1 wherein the first dielectric layer has a thickness approximately the same as the predetermined thickness of the semiconductor chip.

3. An integrated circuit device as claimed in claim 1 wherein the microstrip line board further includes:

a second dielectric layer formed of dielectric material, a third conductive layer formed of electrically conductive material and bonded to a first side of the second dielectric layer and defining a second plurality of conducting elements, and a fourth conductive layer formed of electrically conductive material and bonded to a second side of the second dielectric layer and defining a second electrical ground plane, and a third dielectric layer formed of dielectric material disposed between and bonded on a first side to the second conductive layer and bonded on a second side to one of the third conductive layer and the fourth conductive layer.

4. An integrated circuit device as claimed in claim 3 wherein the first dielectric layer is formed of polytetrafluoroethylene.

5. An integrated circuit device as claimed in claim 4 wherein the second dielectric layer is formed of fibers impregnated with a bonding resin.

6. An integrated circuit device as claimed in claim 5 wherein the second dielectric layer is formed of fiberglass reinforced epoxy resin.

7. An integrated circuit device as claimed in claim 6 wherein the third dielectric layer is formed of fibers impregnated with a bonding resin.

8. An integrated circuit device as claimed in claim 1 wherein the portion of the second conductive layer exposed at the bottom of the pocket is gold plated and the contact patch includes a layer of gold.

9. An integrated circuit device as claimed in claim 8 wherein the bonding material is silver filled epoxy.

10. An integrated circuit device comprising:

a semiconductor chip having a gold plated surface on a first side and having a predetermined thickness; and a microstrip line board having:

a first dielectric layer formed of dielectric material, a first transmission layer formed of electrically conductive material and bonded to a first side of the first dielectric layer and defining a plurality of conducting elements including a microstrip transmission line and a plurality of adjacent ground lines, a first ground plane layer formed of electrically conductive material and bonded to a second side of the first dielectric layer and defining a first electrical ground plane and electrically connected to the ground lines by a plurality of vias extending from the first ground plane to the ground lines, the board having a pocket formed therein passing through the first transmission layer and through the first dielectric layer and the pocket being open on the first side and being closed on the second side by the first ground plane layer and a portion of the ground plane layer being exposed at a bottom of the pocket and the pocket being of substantially the same size and shape as the semiconductor chip and the pocket receiving the semiconductor chip with the first side of the semiconductor chip disposed toward the ground plane layer; and a layer of bonding material disposed in the pocket between the gold plated surface of the semiconductor chip and the first ground layer and the layer of bonding material mechanically and electrically connecting the semiconductor chip to the first ground layer.

11. An integrated circuit device as claimed in claim 10 wherein the first dielectric layer has a thickness slightly less than a thickness of the semiconductor chip.

12. An integrated circuit device as claimed in claim 10 wherein the microstrip board further includes:

a second dielectric layer formed of dielectric material, a power and control layer formed of electrically conductive material and bonded to a first side of the second dielectric layer and defining a second plurality of conducting elements, and a second ground plane layer formed of electrically conductive material and bonded to a second side of the second dielectric layer and defining a second electrical ground plane; and a third dielectric layer disposed between and bonded to the first ground plane layer and the power and control layer.

13. An integrated circuit device as claimed in claim 12 wherein the first dielectric layer is formed of polytetrafluoroethylene.

14. An integrated circuit device as claimed in claim 13 wherein the second dielectric layer is formed of fibers impregnated with a bonding resin.

15. An integrated circuit device as claimed in claim 14 wherein the second dielectric layer is formed of fiberglass reinforced epoxy resin.

16. An integrated circuit device as claimed in claim 15 wherein the third dielectric layer is formed of fibers impregnated with a bonding resin.

17. An integrated circuit device as claimed in claim 10 wherein a bottom surface of the pocket is gold plated.

18. An integrated circuit device as claimed in claim 17 wherein the bonding material is silver filled epoxy.

* * * * *